United States Patent [19]
Thamsirianunt et al.

[11] Patent Number: 6,121,805
[45] Date of Patent: Sep. 19, 2000

[54] UNIVERSAL DUTY CYCLE ADJUSTMENT CIRCUIT

[75] Inventors: Manop Thamsirianunt, Fremont; Vincent S. Tso, Milpitas, both of Calif.

[73] Assignee: Exar Corporation, Fremont, Calif.

[21] Appl. No.: 09/169,181

[22] Filed: Oct. 8, 1998

[51] Int. Cl.[7] .................................................. H03K 3/017
[52] U.S. Cl. ......................... 327/175; 327/176; 327/131
[58] Field of Search .................................. 327/172, 173, 327/174, 175, 176, 131, 115, 336; 375/238, 239

[56] References Cited

U.S. PATENT DOCUMENTS

| | | | |
|---|---|---|---|
| 3,883,756 | 5/1975 | Dragon | 327/176 |
| 4,620,312 | 10/1986 | Yamashita | 375/238 |
| 4,736,118 | 4/1988 | Fischer | 327/175 |
| 4,803,445 | 2/1989 | Yamasaki | 331/177 R |

*Primary Examiner*—Minh Nguyen
*Attorney, Agent, or Firm*—Townsend and Townsend and Crew LLP

[57] ABSTRACT

A duty cycle control circuit that consumes lower power and smaller silicon area, and is less susceptible to noise or jitter. In one embodiment, the invention includes a divide-by-two circuit that is edge triggered and generates a signal at its output with half the frequency of the input signal but with a 50% duty cycle. The divide-by-two circuit is followed by a frequency restore circuit that restores the original frequency of the input signal but with its duty cycle regulated at about 50%, or any other desired level.

19 Claims, 3 Drawing Sheets

UNIVERSAL DUTY CYCLE ADJUSTMENT CIRCUIT

BACKGROUND OF THE INVENTION

The present invention relates in general to integrated circuits, and in particular to a power efficient and cost effective circuit for adjusting duty cycle of periodic signals.

In some circuits such as those used in communication systems, there is often a need for a reference signal with a tightly controlled duty cycle. For example, timing requirements such as transmission templates in communication systems do not permit reference signals having a duty cycle that deviates much from 50%. In telecommunication systems such as T1/E1 or T3/E3/STS1, however, a reference clock signal may be supplied from different sources resulting in a duty cycle that is not well controlled. To adjust the duty cycle of the reference clock in such systems, designers often use phase-locked loops (PLLs) or various types of pulse shaping filters. These types of timing adjustment circuitry that rely on feedback techniques or filtering, while effective in providing accurate control, tend to be more susceptible to noise, consume larger silicon area, and contribute appreciably to power dissipation. These drawbacks are exacerbated in applications involving multiple channels on the same silicon die wherein each channel requires a separate timing adjustment circuit and crosstalk between adjacent channels is a concern.

There is a need for duty cycle adjustment circuitry that is robust and efficient in terms of power consumption and circuit area.

SUMMARY OF THE INVENTION

The present invention provides a duty cycle control circuit that consumes lower power and smaller silicon area, and is less susceptible to noise or jitter. Broadly, the duty cycle correction circuit of the present invention regulates the duty cycle of an input reference signal by generating precise timing pulse edges from the input signal. In one embodiment, the invention includes a divide-by-two circuit that is edge triggered and generates a signal at its output with half the frequency of the input signal but with a 50% duty cycle. The divide-by-two circuit is followed by a frequency restore circuit that restores the original frequency of the input signal but with its duty cycle regulated at about 50% or any other desired level. The circuit of the present invention thus does not rely on feedback mechanisms, is smaller in size, consumes less power, and is less susceptible to noise.

Accordingly, the present invention provides in one embodiment, a circuit for adjusting the duty cycle of an input signal including a divide-by-two circuit having an input coupled to receive the input signal, a switched current source circuit having an input coupled to an output of the divide-by-two circuit and an output coupled to an integrating capacitor, a slicer having a first input coupled to the integrating capacitor and a second input coupled to a reference signal, a logic circuit configured to combine an output of the slicer with an output of the divide-by-two circuit to generate an output signal having a frequency substantially equal to the frequency of the input signal and a duty cycle adjusted by the reference signal.

In another embodiment, the present invention provides a method for adjusting the duty cycle of an input signal including the steps of applying the input signal to a divide-by-two circuit, generating a triangular signal by charging and discharging a capacitor in response to an output of the divide-by-two circuit, generating a square-wave signal with its duty cycle adjusted by comparing the triangular signal with a reference signal, and doubling the frequency of the square-wave signal by logically combining the square-wave signal with the output of the divide-by-two circuit.

A better understanding of the nature and advantages of the circuit and method for adjusting a signal's duty cycle according to the present invention may be gained with reference to the detailed description and drawings below.

DESCRIPTION OF THE SPECIFIC EMBODIMENTS

Figure 1:
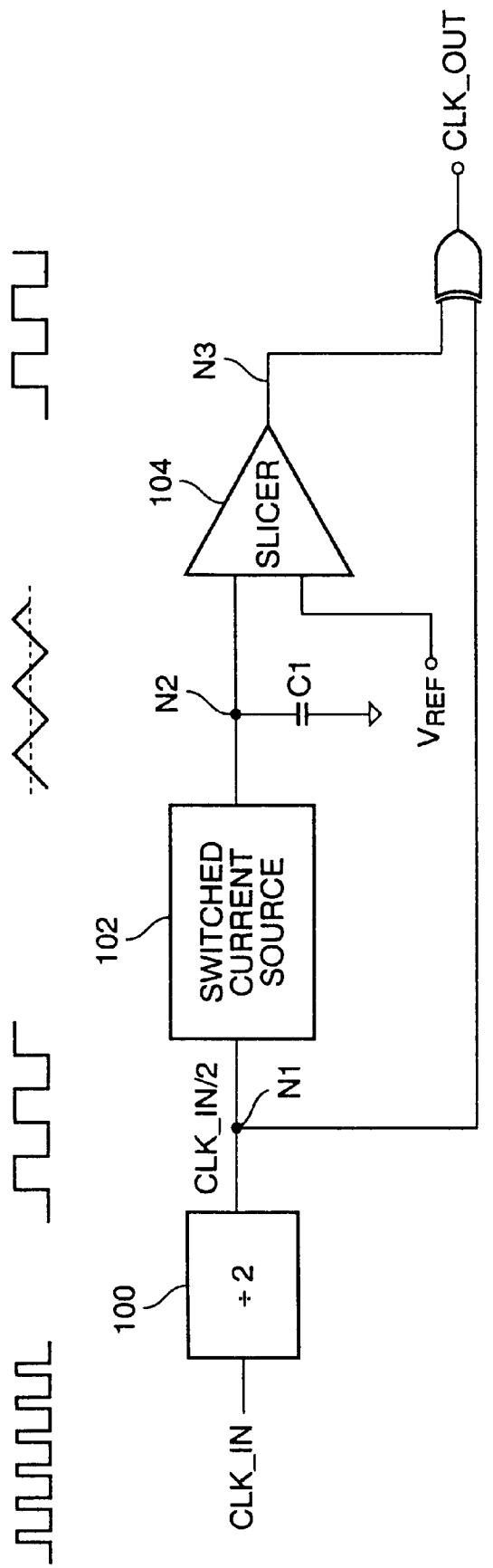
FIG. 1 is a simplified block diagram of the duty cycle adjustment circuit according to one embodiment of the present invention.

Referring to FIG. 1, there is shown a simplified block diagram of the duty cycle adjustment circuit according to one embodiment of the present invention. The circuit includes an edge-triggered divide-by-two block 100 that receives at its input a periodic input signal CLK_IN that may have a highly skewed duty cycle. Signal CLK_IN/2 controls a switched current source circuit 102 that charges or discharges capacitor C1 with a predefined amount of current in response to the CLK_IN/2 signal. This generates a triangular signal at the output of switched current source 102 (node N2). The triangular signal is then applied to a slicer circuit 104 that compares the level of the triangular signal to a reference signal Vref and generates a square-wave signal at its output (node N3). An exclusive OR circuit is then used to restore the frequency of the input signal CLK_IN by combining the signal at node N3 with the signal at node N1. The signal at the output CLK_OUT is thus a square-wave signal having the same frequency as CLK_IN and with a 50% duty cycle.

Figure 2:
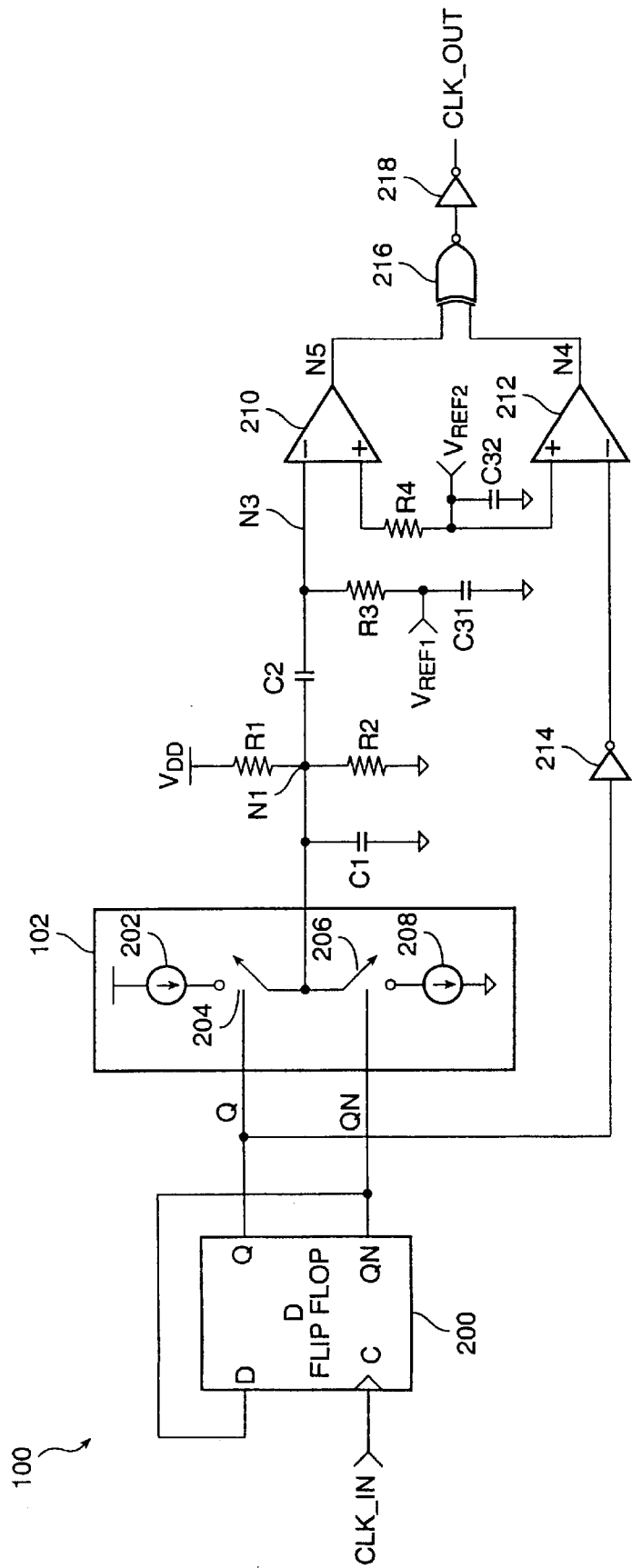
FIG. 2 shows an exemplary circuit implementation of the duty cycle adjustment circuit of the present invention.
Figure 3:
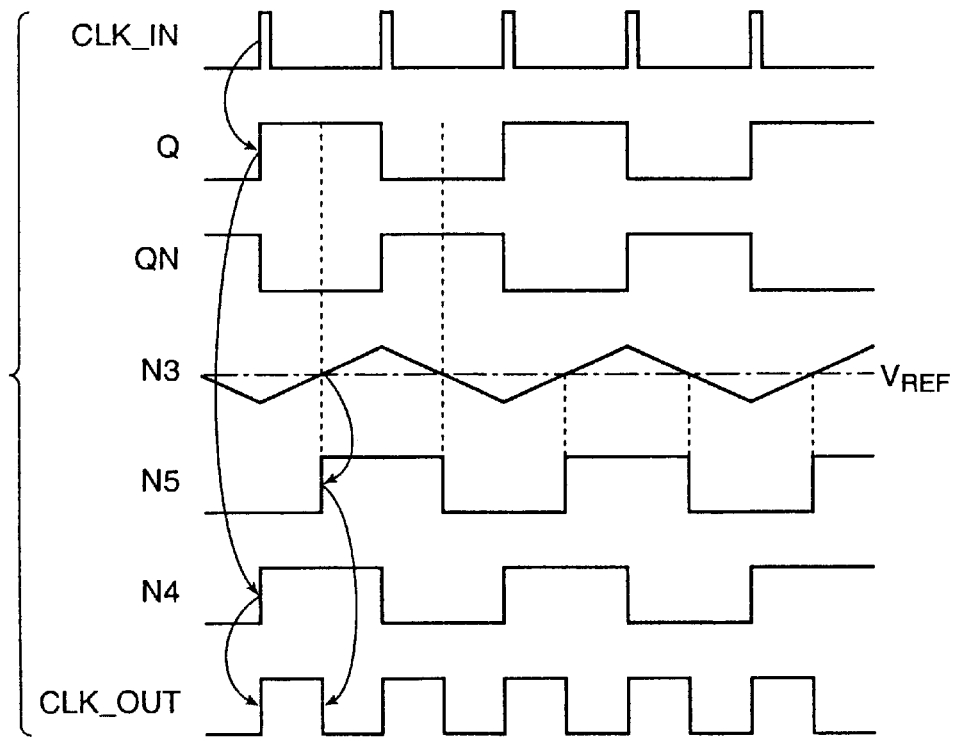
FIG. 3 is a timing diagram illustrating the operation of the duty cycle adjustment circuit of the present invention.

The details of the operation of the present invention will be described hereinafter in connection with the embodiment shown in FIG. 2 and the timing diagram of FIG. 3. FIG. 2 shows a more detailed exemplary circuit implementation of the duty cycle adjustment circuit of the present invention. The same reference numerals are used herein to denote the same elements in all figures. Divide-by-two 100 is made up of a D-type flip flop 200 having a complementary outputs Q and QN, with QN connected to its D input. The clock input C of flip flop 200 connects to the input to receive the signal CLK_IN. D-type flip flop 200 is an edge triggered flip flop that responds, in this exemplary embodiment, to the rising edge of CLK_IN. The input signal CLK_IN as shown in FIG. 3 is a periodic signal with a severely skewed duty cycle (e.g., 10%). Because flip flop 200 in the divide-by-two circuit is edge triggered, the resulting pulses at Q and QN have 50% duty cycle regardless of the duty cycle of the input clock. D-type flip flop 200 generates at its outputs Q and QN signals having a 50% duty cycle but half the frequency of CLK_IN (see FIG. 3).

Figure 4:
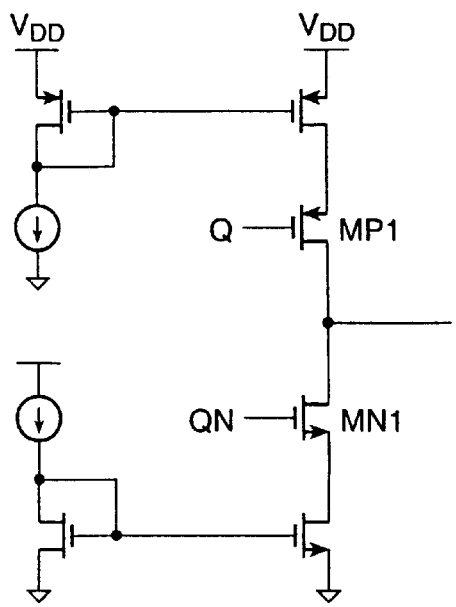
FIG. 4 is an exemplary circuit implementation of a switched current source for use in the duty cycle adjustment circuit of the present invention.

Signals Q and QN having a period twice that of CLK_IN are then used for controlling the timing of opening and closing of switches 204 and 206 in switched current source 102. An example of a circuit implementation using MOS transistor for switched current source 102 is shown in FIG. 4, where transistors MP1 and MN1 respectively implement switches 204 and 206. When switch 204 is closed, capacitor C1 is charged by current source 202 having current I, and when switch 206 is closed capacitor C1 is discharged by current source 208 having current I. Thus capacitor C1 is charged and discharged with two equally sized constant current sources at half the frequency of CLK_IN. The linear operation of this circuit results in a triangular signal at node N1 that rises when Q is high (QN is low) and falls when QN is high (Q is low). Resistors R1 and R2 are bias resistors that provide a dc level for linear biasing of the high impedance output of current source 102. Resistors R1 and R2 also provide for some level of compensation for any mismatch due to the fabrication process that may occur between the currents of current sources 202 and 208. Without R1 and R2, the mismatch between the charge and discharge currents can introduce a sufficient dc offset to cause wave-form clipping at node N1. The value of R1 and R2 (R1=R2) is set conjunction with the frequency range of operation to avoid second order non-linear characteristics.

The signal at node N1 is ac coupled through capacitor C2 to remove any residue dc offset at node N1. The triangular signal appears at node N3 as shown in FIG. 3. This signal is dc biased by a reference signal Vref1 stabilized by resistor R3 and capacitor C31, and connects to the negative input of a high-speed comparator 210. The positive input of comparator 210 connects to another reference signal Vref2 that is stabilized by resistors R4 and capacitors C32. The reference signals Vref1 and Vref2 are used for slicing the signal at node N3 and are preferably generated by a stable source such as a band-gap circuit. Using the same signal for both Vref1 and Vref2 (i.e., connecting the two to one reference signal), ensures that the slicing occurs at half the amplitude of the signal at node N3. This coincides with the center of the positive pulse at Q as shown in FIG. 3. With Vref1= Vref2, therefore, the signal at the output of comparator 210 (i.e., at node N5) is created with an edge at precisely the mid-point of the positive pulse at Q. The duty cycle of the signal at node N5 is thus determined by the difference between the signal levels at Vref1 and Vref2. In one embodiment, Vref1=Vref2=Vref=½VDD (i.e., half the power supply voltage or at the mid-point of the triangular signal), resulting in a square-wave signal at node N5 with a 50% duty cycle, but with a 90 degree phase shift as compared to the square-wave at node Q. The signal at node N5 and its relationship with the signals at N3 and Q are shown in FIG. 3.

The signal at the output of comparator 210 is fed to one input of an exclusive NOR gate 216. The other input of exclusive NOR gate 216 receives the signal Q after it goes through an inverter 214 and a comparator 212 that is identical to comparator 210 to match the delay in the signal path for the other input of exclusive NOR gate 216. As shown in FIG. 3, the signal at node N4 (output of comparator 212) essentially replicates Q. The output of exclusive NOR gate 216 is inverted by inverter 218 and supplied as the circuit output CLK_OUT. By thus performing an exclusive OR function between the signal at Q and the signal at node N5 which corresponds to Q but with a precise 90 degree phase shift (as shown in FIG. 3), the output signal CLK_OUT is a signal with double the frequency of Q having a 50% duty cycle.

Referring to FIG. 3, the timing diagram illustrates that the duty cycle adjustment circuit of the present invention operates such that one edge (e.g., the rising edge) of CLK_OUT is determined by CLK_IN (which generates Q), and the opposite edge is determined by Vref (which generates the signal at N5). By varying the reference signal levels Vref1 and Vref2, the circuit of the present invention provides control over the duty cycle of the output signal. The design of the circuit of the present invention provides for different ways of fine tuning the operation of the circuit. For example, the frequency range of operation can be optimized by adjusting any one of a number of different design parameters such as the magnitude of the currents used in switched current source 102, or the value of integrating capacitor C1, or the relative levels of Vref1 and Vref2. The circuit also performs well over process variations by using a combination of choice of component values and the device layout matching. Because this circuit does not require feedback mechanism or complex filtering schemes, it is very area efficient. The circuit of the present invention is particularly well suited for multi-channel telecommunication devices where many duty cycle adjustment circuits are needed.

In conclusion, the present invention provides a duty cycle control circuit that consumes lower power and smaller silicon area, and is less susceptible to noise or jitter. The invention includes a divide-by-two circuit that is edge triggered and generates a signal at its output with half the frequency of the input signal but with a 50% duty cycle. The divide-by-two circuit is followed by a frequency restore circuit that restores the original frequency of the input signal but with its duty cycle regulated at about 50% or any other desired level. While the above is a complete description of the preferred embodiment of the present invention, it is possible to use various alternatives, modifications and equivalents. Therefore, the scope of the present invention should be determined not with reference to the above description but should, instead, be determined with reference to the appended claims, along with their full scope of equivalents.

What is claimed is:

1. A circuit for adjusting the duty cycle of an input signal, comprising:
    a divide-by-two circuit having an input coupled to receive the input signal;
    a switched current source circuit having an input coupled to an output of the divide-by-two circuit, and an output coupled to an integrating capacitor;
    a slicer having a first input coupled to the integrating capacitor and a second input coupled to a reference signal;
    a logic circuit configured to combine an output of the slicer with the output of the divide-by-two circuit to generate an output signal having a frequency substantially equal to the frequency of the input signal.

2. The circuit of claim 1 wherein the divide-by-two circuit comprises an edge triggered flip flop.

3. The circuit of claim 2 wherein the switched current source circuit comprises current sources and switches that operate in response to the output of the divide-by-two circuit to charge or discharge the integrating capacitor.

4. The circuit of claim 3 wherein the switched current source circuit comprises:
    a charging current source;
    a charging switch coupled between the charging current source and the integrating capacitor, and having a control terminal coupled to the divide-by-two circuit;
    a discharging current source; and
    a discharging switch coupled between the discharging current source and the integrating capacitor, and having a control terminal coupled to the divide-by-two circuit.

5. The circuit of claim 3 further comprising a pair of dc biasing resistors coupled between high and low power supplies and the output of the switched current source circuit.

6. The circuit of claim 3 wherein the slicer is a comparator and the logic circuit performs an exclusive OR function.

7. The circuit of claim 6 wherein a negative input of the comparator couples to the integrating capacitor, and a positive input of the comparator couples to the reference voltage.

8. The circuit of claim 1 further comprising a matching delay circuit having an identical slicer inserted between the output of the divide-by-two circuit and the logic circuit.

9. The circuit of claim 1 further comprising:

an ac coupling capacitor coupled between the integrating capacitor and the first input of the slicer; and a dc biasing resistor coupled between the first input of the slicer and the reference voltage.

10. The circuit of claim 3 wherein a power supply voltage to the circuit provides a first voltage level and wherein the value of the reference voltage is set to be substantially equal to half the first voltage level.

11. The circuit of claim 3 wherein the reference voltage is set to a value to generate a square-wave at the output of the slicer having a phase shifted 90 degrees with respect to the output of the divide-by-two circuit.

12. A method for adjusting the duty cycle of an input signal comprising the steps of:

applying the input signal to a divide-by-two circuit;

generating a triangular signal by charging and discharging a capacitor in response to an output of the divide-by-two circuit;

generating a square-wave signal by comparing the triangular signal with a reference signal; and doubling the frequency of the square-wave signal by logically combining the square-wave signal with the output of the divide-by-two circuit.

13. The method of claim 12 wherein the step of doubling the frequency of the square-wave signal comprises a step of performing an exclusive OR logical function between the square-wave signal and the output of the divide-by-two circuit.

14. The method of claim 13 wherein the step of generating a square-wave signal generates a square-wave signal having a phase shifted 90 degrees as compared to that of a signal at the output of the divide-by-two circuit.

15. A duty cycle adjustment circuit comprising:

an edge triggered flip flop coupled as a divide-by-two circuit and having an input coupled to receive an input signal;

a switched current source circuit coupled to the edge triggered flip flop and configured to charge and discharge an integrating capacitor in response to complementary outputs of the flip flop;

a comparator having a first input coupled to the integrating capacitor and a second input coupled to a first reference signal; and a logic circuit configured to combine an output of the comparator with an output of the divide-by-two circuit to generate an output signal having a frequency substantially equal to the frequency of the input signal.

16. The duty cycle adjustment circuit of claim 15 wherein the switched current source circuit comprises:

a first current source coupled to the integrating capacitor via a first switch; and a second current source coupled to the integrating capacitor via a second switch.

17. The duty cycle adjustment circuit of claim 16 wherein the first switch is an MOS transistor having a gate terminal coupled to one output of the divide-by-two circuit, and the second switch is an MOS transistor having a gate terminal coupled to a complementary output of the divide-by-two circuit.

18. The duty cycle adjustment circuit of claim 15 wherein a second reference signal couples to the first input of the comparator.

19. The duty cycle adjustment circuit of claim 18 wherein a difference between the first reference signal and the second reference signal adjusts a duty cycle of the output signal.

* * * * *